Figure 1:
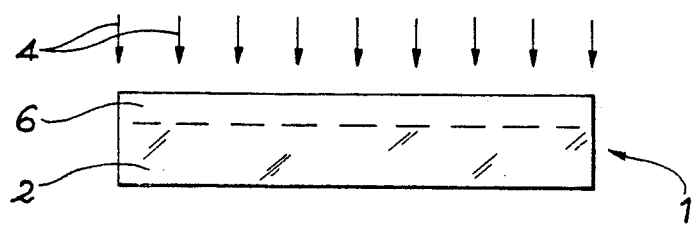

United States Patent [19]

Nissim et al.

[11] Patent Number: 4,914,059

[45] Date of Patent: Apr. 3, 1990

[54] PROCESS FOR THE HEAT FLASH VAPOUR PHASE DEPOSITION OF AN INSULATING LAYER ON A III-V MATERIAL SUBSTRATE AND ITS APPLICATION TO THE PRODUCTION OF A MIS STRUCTURE

[76] Inventors: Yves Nissim, 57 Quai de Dion Bouton, 92800 Puteaux; Marcel Bensoussan, 881 Cours Aquitaine, 92100 Boulogne, both of France

[21] Appl. No.: 236,325

[22] Filed: Aug. 19, 1988

Related U.S. Application Data

[63] Continuation of Ser. No. 113,557, Oct. 27, 1987, abandoned.

[30] Foreign Application Priority Data

Oct. 27, 1986 [FR] France .................. 86 14896

[51] Int. Cl.$^4$ .................. H01L 21/316; H01L 21/318; H01L 29/78
[52] U.S. Cl. ...................... 437/235; 437/41; 437/184; 437/238; 437/241; 437/173; 427/55; 427/255.2; 427/255.3
[58] Field of Search ............ 427/53.1, 54.1, 55, 427/255.1, 255.2, 255.3, 25, 41, 173, 184, 196, 200, 235, 238, 239, 241, 242, 243, 247, 907; 428/446, 447, 448, 450

[56] References Cited

U.S. PATENT DOCUMENTS

| | | | |
|---|---|---|---|
| 4,081,313 | 3/1978 | McNeilly et al. | 437/81 |
| 4,371,587 | 2/1983 | Peters | 437/235 |
| 4,482,393 | 11/1984 | Nishigama et al. | 437/25 |
| 4,532,695 | 8/1985 | Schuermeyer | 437/29 |
| 4,698,486 | 10/1987 | Sheets | 437/247 |

FOREIGN PATENT DOCUMENTS 8605320 9/1986 PCT Int'l Appl. .
2065973 7/1981 United Kingdom ............. 437/173

OTHER PUBLICATIONS

Ghandhi, *VLSI Fabrication Principles,* New York: John Wiley and Sons, Inc., 1983, pp. 517-520, 214-215.
Japanese Journal of Applied Physics, Aug.-Sep. 1984, pp. 663-666, Kobe, Japan, Hayafuji, et al., "Photo—CVD Dielectric Films on InP".
Revue Phys. Appl. 19, 155-N9 (1984), Carmona, et al., "The Role of Plasma Oxide in InP MIS Structures".
J. Electchem. Soc. 124 (11), 1781-1784, (1977), K. V. Vaidyanathan et al., "Study of Encapsulants for Annealing GaAs".
Appl. Phys. Letters 42(11), Jun. 1983, pp. 950-952, F.H.P.M. Habraken, et al., "Surface and Interface Nitridation . . . ".
Patent Abstracts of Japan 6(67)E 104-105, (SONY), "Forming Method of Insulating Film".
Thin Solid Films 64 (1), 49-55, (1979), Wilmsen, C. W., "Interface Formation of Deposited Insulator Layer on GaAs and InP".
Rutérana et al., "High Resolution Electron Microscopy of the GaAs/Si$_3$N$_4$ Interface Produced by Multipolar Plasma Deposition", Appl. Phys. Lett. 49(11), Sep. 15, 1986, pp. 672-673.
Geib et al., "Influence of Interfacial Structure on the Electronic Properties of SiO$_2$/InP MISFET's", J. Vac. Sci. Technol. B2(3), Jul.-Sep. 1984, pp. 516-521.

*Primary Examiner*—Brian E. Hearn
*Assistant Examiner*—M. Wilczewski
*Attorney, Agent, or Firm*—Michael N. Meller

[57] ABSTRACT

Heat flash vapor phase deposition process of an insulating layer on a III-V material substrate and its application to the production of a MIS structure. Using the same enclosure, said process comprises carrying out an etching of a III-V substrate (2), forming on said substrate at least one protective layer (8,10) for the substrate surface constituting the active zone (6) of the MIS structure, or even producing the active layer by epitaxy, depositing an insulating layer (12) by CVD at high temperature produced by irradiating the surface of the sample (1) with tungsten halogen lamps and optionally forming on the insulating layer (12) a conductive layer (14) at high temperature by irradiation with tungsten halogen lamps, thus completing the MIS structure.

14 Claims, 3 Drawing Sheets

PROCESS FOR THE HEAT FLASH VAPOUR PHASE DEPOSITION OF AN INSULATING LAYER ON A III-V MATERIAL SUBSTRATE AND ITS APPLICATION TO THE PRODUCTION OF A MIS STRUCTURE

This application is a continuation, of application Ser. No. 113,557, filed 10/27/87 now abandoned.

DESCRIPTION

The invention relates to a process for the vapour phase deposition of an electrically insulating layer on a III-V material substrate usable in particular either as a MIS structure gate insulant (transistor, CCD, memory), or as a surface passivating layer.

It is pointed out that a III-V material contains at least one element in column III and at least one element in column V of the periodic classification of elements.

The obtaining of electrical insulants having satisfactory properties (interface states, electrical behaviour, mechanical behaviour, porosity, time behaviour, etc.), both for MIS transistor gate insulants and as insulants for passivating and protecting integrated circuits, constitutes the major limitation to the extensive use of III-V compounds in microelectronics and in optoelectronic integration. In particular, hitherto there is no completely satisfactory technological process for producing MIS structures (metal-insulantsemiconductor) on GaAs, InP, $Al_xGa_yIn_{1-x-y}As$ or $Ga_xIn_{1-x}As_yP_{1-y}$ with $0 \leq x \leq 1$ and $0 \leq y \leq 1$, which are the basic materials in III-V technology.

The main reason for this is that, contrary to silicon, III-V compounds have no stable native oxides with adequate electronic properties for electrical insulation.

The thermal oxidation of these compounds, which would have been the natural way to produce insulants, is complex and requires unusual pressure conditions. Moreover, the tests in this direction have not as yet been very convincing, as is shown by the document "High pressure thermal oxide/InP interface" by C. W. Wilmson et al., J. Vac Sci. Technol. B 3 (4), 1103, 1985.

It would even seem that the layer of native oxides (0.1 nm approximately) constitutes a limitation to the quality of the electrical properties of the interface, as is indicated in the document "Influence of interfacial structure on the electronic properties of SiO2/InP MISFET'S", by K. M. Geib et al., J. Vac. Sci. Tech B 2 (3) 516, 1984.

Moreover, there is a certain number of possible oxides with one or other of the elements of these III-V compounds, or even with a combination of both leading to phase mixtures, whereof some are unstable, as is indicated in the document "Analysis of native oxide films and oxide-substrate reaction on III-V semiconductors using thermochemical phase diagrams" by G. P. Schwartz, published in Thin Solid film, 103 (3) 1983. Thus, the only procedure used at present is that of deposited or joined insulants.

The most widely used insulants are $SiO_2$ and $Si_3N_4$. This is due to the fact that well controlled processes for the deposition of these materials have been developed in silicon technology, which also requires deposited insulants.

One of the main limitations for use, without special precautions, of these deposition methods for III-V compounds is the saturating vapour tension of the V element, which is much higher than that of the III element. For example, the non-congruent surface decomposition temperatures of InP and GaAs are respectively approximately 300° C. and 550° C. Above these temperatures, there is a preferred evaporation of the V element, leaving a III element excess on the surface, which has the tendency to form metallic aggregates leading to not very satisfactory interface states.

Naturally this temperature limitation has hitherto led in connection with III-V compounds towards so-called low temperature insulant deposition processes, i.e. at temperatures below the non-congruent decomposition temperature of the substrate surface namely temperatures below 300° C. in the case of InP.

Firstly the insulants were deposited by conventional chemical vapour phase deposition processes. However, these processes almost always led to a density of electronic interface states preventing any production of a usable component. It is well known that so-called low temperature insulants have an inferior quality as compared with those produced at a higher temperature.

Research aimed at deposition processes making it possible to further lower the deposition temperature has led to the development of processes such as plasma-assisted chemical vapour phase deposition and ultraviolet radiation-assisted chemical vapour phase deposition. Although not completely satisfactory, encouraging results have been obtained with these two latter processes.

In the ultraviolet-assisted deposition described in the communication given at the Journées de la Société Francaise du Vide, Paris, Oct. 22-23 1984 "Dépôt de couches minces diélectriques ($SiO_2$, $Si_3N_4$) en CVD assisté par UV (Hg) sur matériaux III-V" by P. Dimitriou and A. Scavennec, it would appear that the quality of the insulant has been somewhat improved.

However, with regards to plasma-assisted deposition described in "Interface properties of metal/oxide/semiconductor and metal/semiconductor structures on $Ga_{1-x}In_xAs$ with $x \dot= 0.35$ and 0.10" by S. Gourier et al, published in Thin Sol. Films, 103, 155, 1983 and "High resolution electron microscopy of the $GaAs/Si_3N_4$ interface produced by multipolar plasma deposition" by P. Ruterana et al, published in Appl. Phys. Lett. 49, (11), p. 672, September 15 1986, it is rather the aspect of the preparation or conditioning of the surface of the substrate prior to the deposition of the insulant, which offers interesting perspectives, but without being really convincing.

This research would appear to have revealed a second limitation to the deposition of insulants on III-V material substrates, which is linked with the conditioning of the surface of the substrates prior to the deposition of the insulants.

For GaAs, the surface properties mean that, no matter what the deposition method, the Fermi level is blocked in the centre of the forbidden band by more than $10^{12}$ interface states/$cm^2$ and it has not hitherto proved possible to reduce this. In this case, the existing processes are mainly directed at maintaining the stoichiometry on the surface of the substrate.

However, in the case of InP or $Ga_xIn_{1-x}As$ with $0 \leq x < 1$, it is possible to obtain good quality MIS structures. The Fermi levels for the latter compounds are not blocked in a defective surface manner and, as a function of the way in which the substrate surface is conditioned or prepared, it is possible to significantly reduce the number of interface states. It is therefore clear that for InP and $Ga_xIn_{1-x}As$, the substrate surface preparation stage prior to insulant deposition is of a crucial nature.

The present invention specifically relates to a process for depositing an insulating layer on a III-V material substrate making it possible to obviate the aforementioned disadvantages. In particular, it makes it possible to obtain insulating layers having very satisfactory electrical, mechanical, time behaviour, interface and similar properties.

It is based on chemical vapour phase deposition or CVD and on the use of a heat flash or fast thermal treatment of the substrate.

It should be noted that the fast thermal treatment is known for the annealing of implanted GaAs substrates with a view to electrically activating the implanted ions. A certain number of specific properties for said annealing is described in the article "Rapid thermal annealing of ion implanted semiconductors", by J. Narayan and O. W. Holland, Journal of Appl. Phys. 56, 2913, 1984.

More specifically, the invention relates to a process for the deposition of an electrically insulating layer on a III-V material substrate, characterized in that it comprises at least one first stage of preparing the surface of the substrate and a second stage of the chemical vapour phase deposition of said insulating layer at high temperature, i.e. at a temperature exceeding the non-conguent decomposition temperature of the substrate surface, whereby during the second stage the substrate undergoes a heat flash. In other words, the high temperature is produced by flash irradiation of the substrate.

The first and second stages are preferably performed in the same enclosure. Moreover, the first stage is advantageously performed by subjecting the substrate to a heat flash.

High temperature is understood to mean temperatures exceeding 300° C. in the case of InP. Moreover, substrate is understood to mean a solid substrate, but also any layer epitaxied or deposited on a solid substrate, as well as any region implanted in a solid substrate.

The process according to the invention combines the well known advantages of chemical vapour phase deposition and the flexibility of use of different gases, the pressure of these gases, the possibility of the in situ cleaning of the substrate surface, etc. In addition, due to the surface decomposition of the III-V substrates at high temperature, the heat flash chemical vapour phase deposition method makes it possible to rapidly bring-about temperature changes, thus giving the possibility of acting on the kinetics of the surface phenomena of substrates.

Advantageously, the heat corresponding to a short duration thermal heating is performed in an oven with tungsten halogen lamps. The duration of the heat flash is dependent on the nature of the substrate and in particular the substrate decomposition temperature. The halogen oven permits;

(1) an extremely fast temperature rise time $t_M$ of approximately 5 seconds, even for high temperatures such as 1200° C. and in a controllable manner, (2) a perfect stability over the chosen temperature range, by means of a counter-reaction or feedback directly analysing the temperature induced on the sample by thermocouple or optical pyrometer, (3) an extremely fast temperature fall time $T_D$ equivalent to a tempering of the substrate and in a controllable manner, $T_D$ being approximately 12 seconds, (4) a localized heating on the substrate linked with optical absorption for the latter.

In a tungsten halogen lamp oven, the temperature uniformity is ensured by the geometry of the lamps and the sample to be treated is not in thermal contact with its support (floating sample), thus ensuring a low thermal inertia. The latter property makes it possible to reveal a supplementary advantage of the inventive process (heat, flash CVD). Thus, as heating takes place locally on the sample, the complete oven has cold walls. This completely eliminates any risk of pollution of these walls and therefore of the samples, as well as any problem of autodoping of the latter. Moreover, as the deposition process lasts a short time (a few seconds), the phenomena of re-diffusion of impurities into the sample are also greatly reduced.

Thus, the problem of the instability of the surface of III-V material substrates, linked with the preferred departure of the V element during high temperature heating, is inventively solved by the flash annealing of the substrates. Thus, it was demonstrated in the aforementioned Narayan article, that a GaAs substrate, i.e. a III-V material, could withstand high temperatures for irradiation times less than one minute. For example, unprotected GaAs can withstand a temperature of 850° C. for several seconds (5 to 10 seconds) without any risk of deterioration and for InP the temperature is 720° C. for the same duration.

The inventive use of high temperatures (>300° C.) for a CVD deposition of insulants by heat flash makes it possible to obtain high quality·volume insulants, due to their good stoichiometry having resistivities higher than those obtained by low temperature deposition methods. Thus, the better the stoichiometry of the insulant, the greater the reduction in the movement of the free charges in the insulant, which are responsible for hysteresis phenomena in the current-voltage characteristics of an e.g. MIS structure.

Moreover, the use of high temperatures induced by heat flash according to the invention also makes it possible to gain as regards the growth rate of the insulating layer, so that short irradiation times can be used. These two parameters are a function of the selected chemical deposition reaction.

According to the invention, the chemical deposition stage can be performed at atmospheric or low pressure (below 133 Pa), each of these solutions having advantages and disadvantages. However, low pressure chemical vapour phase deposition gives better deposits from the uniformity standpoint.

The inventive process is applicable to all III-V material substrates and in particular to substrates of InP, $Ga_xIn_{1-x}As_yP_{1-y}$, $Ga_yAl_{1-y}As$, $Al_xGa_yIn_{1-x-y}As$, with $0 \leq x \leq 1$ and $0 \leq y \leq 1$, GaSb, InSb, GaP. As the basic materials in III-V technology are GaAs, InP, $Ga_xIn_{1-x}As_yP_{1-y}$ and $Al_xGa_yIn_{1-x-y}As$ with $0 \leq x \leq 1$ and $0 \leq y \leq 1$, the inventive process is preferably applied to these materials.

The III-V material substrate surface preparation stage can involve a chemical cleaning stage, which is very effective for a InP substrate, produced outside the chemical vapour phase deposition enclosure. Cleaning makes it possible to expose the surface of the semiconductor substrate, in particular by eliminating the native oxide and without creating any supplementary defect.

The substrate surface preparation stage can also involve an etching stage performed in the deposition enclosure. This etching stage can comprise in itself the substrate surface preparation stage or can be preceded by the aforementioned chemical cleaning stage. It also serves to expose the surface of the substrate, without creating supplementary defects. The etching stage is performed by subjecting the substrate to a heat flash using tungsten halogen lamps, either in vacuo for releasing the few nanometers of native oxides, or in the presence of a chlorinated gas, such as $CCl_4$, $SiCl_4$ or $GeCl_4$.

When etching is performed in vacuo, the temperature induced by the tungsten halogen lamps on the substrate is 300° C. for InP and 550° C. for GaAs.

The duration of the thermal irradiation and that of the chlorinated gas action for a GaAs substrate varies between 3 and 5 seconds and for an InP substrate between 1 and 10 seconds.

The substrate surface preparation stage can, apart from the aforementioned stages, include a stage of supplying V elements to the substrate surface. This stage can in itself constitute the substrate surface preparation stage. This supply of the V element makes it possible to compensate deficiencies thereof on the substrate surface. This supply is broughtabout by subjecting the substrate surface to a heat flash, the irradiation of the substrate being produced by tungsten halogen lamps, in the presence of a flow of $As_2$ or $P_2$, obtained by thermal decomposition of $AsH_3$ or $PH_3$ in the deposition enclosure.

$As_2$ and $P_2$ can be used for any of the III-V material substrates and in particular for GaAs, InP, $Ga_xIn_{1-x}As_yP_{1-y}$ and $Al_xGa_xIn_{1-x-y}As$ with $0 \leq x \leq 1$ and $0 \leq y \leq 1$.

In the particular case of an InP substrate, the heat flash treatment under an $As_2$ flow significantly improves the electronic properties of the substrate surface from the standpoint of its passivation, by forming a semiconductor layer containing indium and arsenic, said layer having a thickness of a few tenths of a nanometer (0.3 to 3 nm).

The duration of the heat flash and the supply of the V element is between 1 and 10 seconds for InP and between 3 and 15 seconds for GaAs. The temperature induced by flash irradiation on the substrate is between 500° and 700° C. for InP and between 700° and 900° C. for GaAs.

The substrate surface preparation stage can also incorporate a stage of encapsulating said surface by a very thin insulating material protective layer. This encapsulating stage can be carried out alone or combined with the preceding stages. The insulating material can be a nitride or a sulphide which has reacted with the native oxide of the substrate or a deposited silicon dioxide ($SiO_2$) of a few nanometers.

The nitriding or sulphiding of the substrate surface are advantageously performed by subjecting said surface to a heat flash by using tungsten halogen lamps. In the case of a InP substrate, the heat flash nitriding takes place at a temperature of 600° C. for 3 to 10 seconds with $NH_3$. Heat flash sulphiding can be performed with $SH_2$ at a temperature of 550° C. for 3 to 15 seconds for a GaAs substrate and at a temperature of 300° C. for 3 to 10 seconds for an InP substrate.

When the encapsulating layer is of $SiO_2$, the deposition of this layer can be performed by cracking $SiH_4$ in the presence of oxygen at a temperature of 250° to 450° C., or by cracking $Si(OC_2H_5)_4$ in the presence of oxygen at a temperature of 300° to 500° C.

It can also be performed by the deposition by high temperature CVD induced by heat flash of a non-doped polycrystalline silicon layer, which is thermally oxidized under an oxygen atmosphere, as described in the document "Rapid thermal processing of thin gate dielectrics: Oxydation of silicon" by J. Nulman, J. P. Krusius and A. Gat published in IEEE elec. Dev. Lett. vol. 6, 5, 205, 1985.

This $SiO_2$ layer enables the protected substrate for forming the active layer of a MIS structure to withstand the high temperature used for the deposition of the insulating layer for times which can exceed about 10 minutes.

The substrate surface encapsulating stage can also consist of epitaxy of a semiconductor layer of a few nanometers, which also protects the substrate for constituting the active layer of an e.g. MIS structure. This stage is performed just after the heat flash etching.

This epitaxy is performed at high temperature ($\leq 300°$ C.) by thermal decomposition of organo-metallic vapours and which is known as MOCVD and which can be performed in the same deposition frame as the other depositions. This decomposition can be carried out by continuous heating or by heat flash of the surface of the substrate effected by using tungsten halogen lamps according to the invention.

The epitaxied semiconductor layer can be formed of a III element and a V element identical to or different from those constituting the III-V material substrate. For example, in the case of InP, the epitaxied layer can be of InP, InAs, etc. and for GaAs the epitaxied layer can be of GaAs, GaP, etc.

According to the invention, the insulating layer deposited on the III-V material substrate can be an undoped polycrystalline silicon layer, a silicon nitride layer ($Si_3N_4$) or a silicon dioxide layer ($SiO_2$) with a thickness of a few dozen nanometers.

For an undoped polycrystalline silicon layer, deposition can be carried out by cracking $SiH_4$ or $SiH_2Cl_2$ at temperatures between 800° and 1100° C. For example, said deposition with a thickness of approximately 30 nm is carried out by subjecting the substrate to a heat flash using tungsten halogen lamps. The irradiation temperature is 920° C. for 3 seconds.

This polycrystalline silicon layer, which can be used as such, can then be oxidized or nitrided, as described in the aforementioned Nulman document, at a high temperature in the presence reciprocally of oxygen or nitrogen, said oxidation or nitriding taking place under thermal irradiation of the substrate using tungsten halogen lamps in the same deposition frame.

Furthermore, it is possible to directly deposit a nitride layer or a silicon dioxide layer by the chemical reaction of certain gases, at a high temperature induced by a heat flash, the most important of which are referred to hereinafter.

Each of these chemical reactions is to be optimized as a function of the temperature to which the substrate is raised, when it is subject to thermal irradiation by tungsten halogen lamps and as a function of partial pressures of various gaseous constituents. The duration of the deposition of the insulant and the irradiation increases with the desired insulant thickness and ranges between 5 and 120 seconds.

The chemical reactions used for the deposition of an $SiO_2$ insulating layer are given in the following Table 1 and those used for the deposition of a $Si_3N_4$ insulating layer are given in Table 2.

TABLE 1

| Gaseous mixtures | Deposition temperature in °C. |
| --- | --- |
| $Si(OC_2H_5)_4 + O_2$ | 600–900 |
| $SiCl_4 + CO_2 + H_2$ | 1000–1300 |
| $SiCl_4 + N_2O$ | 1000–1200 |
| $SiBr_4 + N_2O$ | 800–1000 |
| $SiH_4 + CO_2 + H_2$ | 800–1100 |
| $SiH_2Cl_2 + N_2O$ | 800–900 |
| $SiH_4 + N_2O$ | 700–800 |
| $SiH_4 + O_2$ | 450–750 |

TABLE 2

| Gaseous mixtures | Deposition temperature in °C. |
| --- | --- |
| $SiH_4 + NH_3$ | 700–1100 |
| $SiH_2Cl_2 + NH_3$ | 700–900 |

In all these chemical reactions, in order to have correct growth rates of the insulating layer (10 to 100 nm/min), it is necessary for the gaseous compound containing the silicon is sufficiently dilute and that the concentration of the oxidizing or nitriding element is high. In the case of a $SiO_2$ layer: $O_2/SiH_4 = 10$.

For further details of the aforementioned deposition reactions, reference can e.g. be made to the article "Low pressure CVD production processes for poly, Nitride and Oxide", by R. S. Rosler, published in Solid State Tech, April 1977, 63 and the article "Comparaison of properties of dielectric films deposited by various method" by W. A. Plishin, published in J. Vac. Sci. Tech. 14, 1064, 1977.

The insulating layer can also be of silicon phosphide, known as PSG, using a cracking of the mixture $SiH_4 + PH_3$ in the presence of oxygen, at a temperature between 300° and 500° C. The advantage of such a solution is, apart from the insulating layer, supplying the surface of the substrate with the V element, thus obviating the need for the aforementioned supply stage.

The heat flash vapour phase deposition process described hereinbefore is advantageously applied to the production of a MIS structure, such as a transistor, a memory point, a shift register, etc.

To this end, the invention also relates to a process for producing a MIS structure on a III–V material substrate having an electrically insulating layer surmounted by a conductive layer, said process having a stage of preparing the surface of the substrate and a stage involving the chemical vapour phase deposition of the insulating layer, as described hereinbefore, as well as a stage of depositing the conductive layer at high temperature.

The conductive layer is advantageously deposited just after the deposition of the insulating layer, using the same deposition enclosure, thus obviating any risk of pollution by the ambient medium.

The conductive layer can be a polycrystalline silicon layer highly doped with phosphorus deposited under heat flash, using tungsten halogen lamps. This deposition e.g. results from a cracking of $SiH_4$ and $PH_3$. The conductive layer can also be of a metal, such as nickel, tungsten, molybdinum, tantalum, etc.

This metallic layer can then be formed by pyrolysis of carbonyle or hexafluoride of the corresponding metal using flash irradiation according to the invention, or laser irradiation as described in the article "Metal Film Deposition by Laser Breakdown chemical Vapor Deposition" by T. R. Jervis and L. R. Newkirk, published in "Beam induced Chemical Processes" edited by R. J. Von Gutfeld, J. E. Greene, H. Schlossberg (M. R. S. Pittsburgh), 1985, p. 7.

The duration of the heat flash for the polycrystalline silicon deposition and the duration of the laser irradiation for the metallic layer deposition are between 5 seconds and a few minutes, as a function of the desired conductive layer thickness. The temperature for depositing the conductive layer is between 700° and 950° C., as a function of its nature. This conductive layer can also be produced from molybdinum or tungsten silicide by successively depositing a polycrystalline silicon layer and a layer of tungsten or molybdinum. The tungsten or molybdinum deposited at high temperature reacts with the polycrystalline silicon to form the corresponding silicide.

Figure 2A:
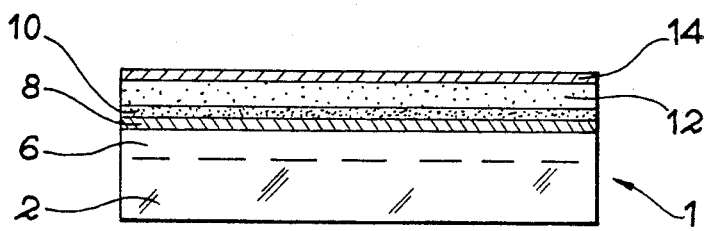
Figure 2B:
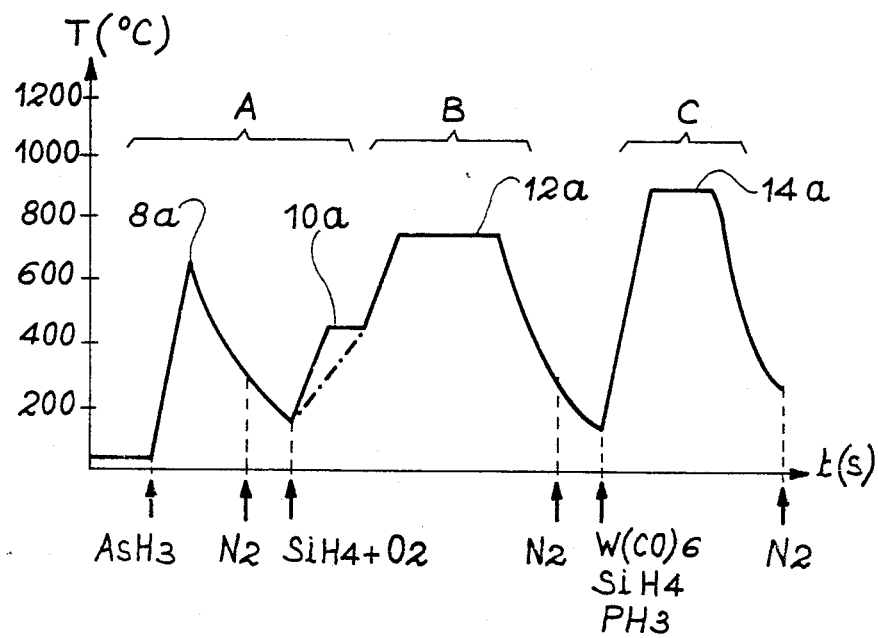

Other features and advantages of the invention can be gathered from the following non-limitative description with reference to the attached drawings, wherein show:

FIGS. 1 to 6 various stages in the production of a MIS structure according to the invention, FIGS. 1, 2a to 6 being longitudinal sections through the MIS structure and FIG. 2b is a graph giving, during the time (t), the temperature cycle (T) and the cycle for introducing the gases into the deposition enclosure for producing an InP MIS structure.

Figure 7:
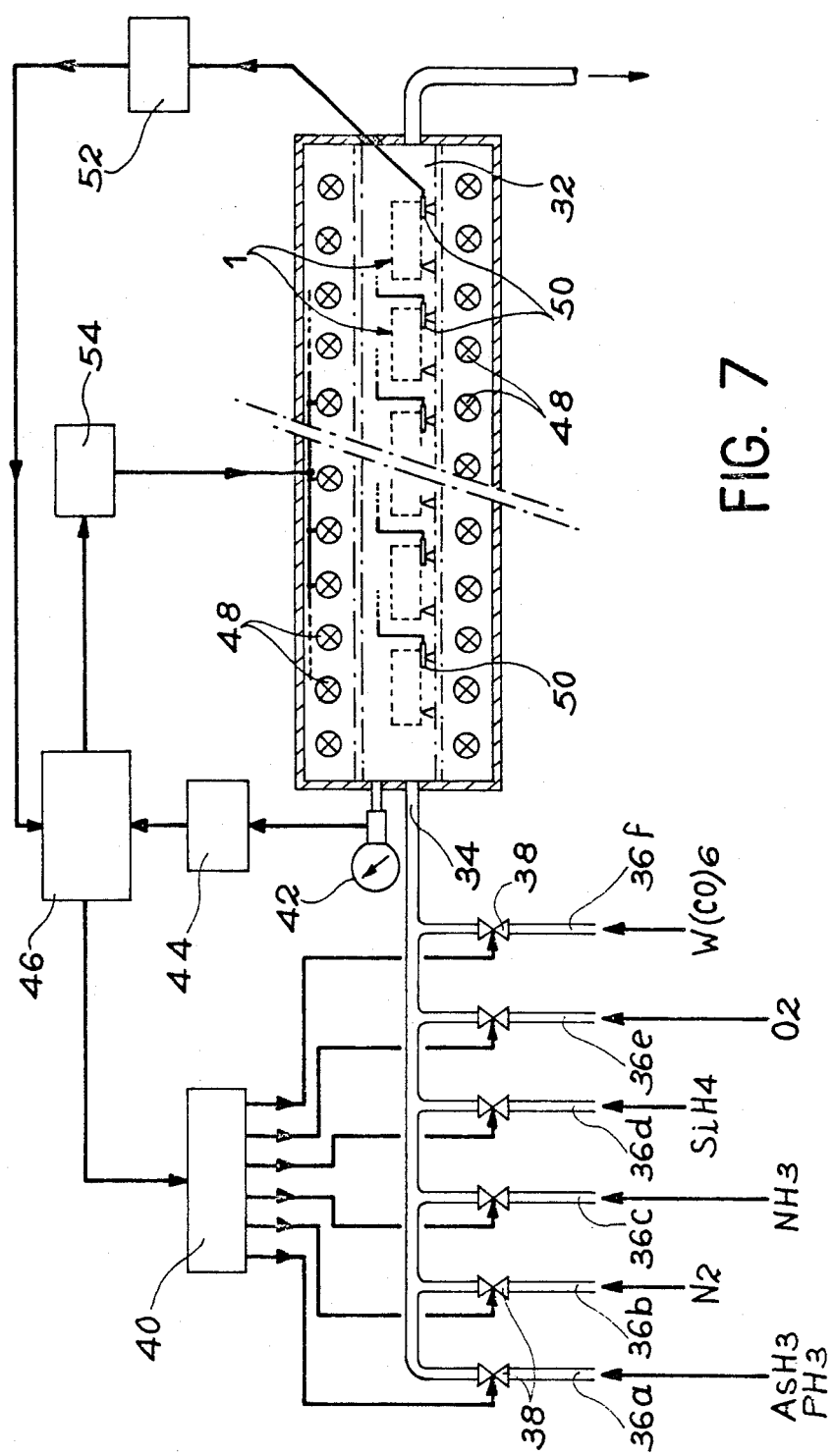

FIG. 7 diagrammatically an apparatus for performing the process according to the invention.

For simplification purposes, the following description relates to the production of an MIS transistor produced on a InP substrate. However, as stated hereinbefore, the invention has a much more general application.

In FIG. 1, the sample 1 to be treated has a semi-insulating InP substrate 2, which is more particularly doped with iron ions and provided on its surface with a doped region 6 constituting the active layer of the MIS structure. Layer 6 is formed by ion implantation 4. The latter is in particular produced with n-type ions at a dose of $5.10^{15}$ to $10^{16}$ atoms/cm$^2$. The n-type ions can be of silicon, selenium, sulphur, etc.

In place of ion implantation, the active layer of the MIS structure can be produced by the epitaxy of a semiconductor layer on substrate 2 by thermal decomposition of organo-metallic materials, phosphine and/or arsine, obtained by continuous heating or heat flash of the surface by means of the irradiation of the surface using tungsten halogen lamps according to the invention.

The following stage of the process, designated A in FIG. 2b, consists of preparing the surface of implanted layer 6 of the substrate with a view to the deposition there of the insulating layer, which will constitute the gate insulant of the MIS structure.

Stage A consists of subjecting the implanted surface of the substrate to an $As_2$ flow, obtained as a result of the thermal decomposition 8a of $AsH_3$ in a vacuum enclosure 32 in FIG. 7, where there is a vacuum of approximately $1.3.10^{-4}$ Pa, in order to form a monolayer 8 based on arsenic and indium, as shown in FIG. 2a. This stage A can also be performed at atmospheric pressure.

Semiconductor layer 8 makes it possible to saturate with element V the implanted surface 6 of the substrate, but also to protect it during the subsequent deposition of the insulating layer at high temperature.

The deposition of the semiconductor layer 8, which is carried out by subjecting to thermal irradiation the implanted surface of the substrate is performed at 650°

C. for 1 to 10 seconds, as indicated in FIG. 2b. This irradiation is produced by tungsten halogen lamps 48 in FIG. 1. Deposition 8 is followed by a purge of the vacuum enclosure using a neutral gas, such as nitrogen (FIG. 2b).

Preparation stage A continues by the deposition on semiconductor layer 8 of an insulating layer 10 (FIG. 2a) constituting an auto-encapsulation of the implanted surface 6 of the substrate or of the epitaxied layer, making it possible to protect said implanted or epitaxied layer during the subsequent deposition of the insulating layer at high temperature by heat flash.

Thus, this auto-encapsulation enables the implanted or epitaxied layer 6 to withstand the high temperature desired for the subsequent deposition of a good insulant for times which can exceed the 10 seconds at which decomposition of the substrate occurs.

The insulating layer 10 is in particular an approximately 3 to 5 nm $SiO_2$ layer obtained by thermal decomposition 10a of $SiH_4$ in the presence of $O_2$, at a temperature of 450° C. for 3 to 10 seconds, as shown in FIG. 2b, or at 300° C. for approximately one minute. The deposition of this $SiO_2$ layer 10 is obtained by an irradiation of the surface of sample 1 using tungsten halogen lamps.

Following the purge of the vacuum enclosure with nitrogen (FIG. 2b), on insulating layer 10 takes place the deposition B (FIG. 2b) of another insulating layer 12 (FIG. 2a), which will form the gate insulant of the MIS structure. This 50 to 100 nm thick insulating layer 12 is in particular an $SiO_2$ layer, obtained like layer 10 by thermal decomposition 12a of $SiH_4$ in the presence of $O_2$ (FIG. 2b), at a temperature of 750° C.

Stage B of chemical vapour phase deposition of insulating layer 12 is performed using thermal irradiation of the surface of sample 1 by tungsten halogen lamps. The duration of the thermal irradiation and that of the action of the gaseous mixture varies between 5 and 30 seconds, as a function of the desired thickness of the $SiO_2$ layer 12.

The following stage of the process, designated C in FIG. 2b, consists of completing the MIS structure by depositing on the surface of insulant 12 a conductive layer 14 (FIG. 2a). Conductive layer 14 is in particular a tungsten silicide layer obtained by the cracking of $SiH_4$ and $PH_3$ at 900° C. (FIG. 2b) followed by tungsten carbonyle pyrolysis, as described in the aforementioned article by T. R. Jervis. This pyrolysis is in particular performed under laser irradiation, at a temperature of 900° C. for approximately 10 minutes, as indicated in FIG. 2b. This high temperature for the deposition of conductive layer 14 also makes it possible to carry out the thermal annealing of the implanted layer 6 of the substrate, making the implanted ions electrically active.

Figure 3:
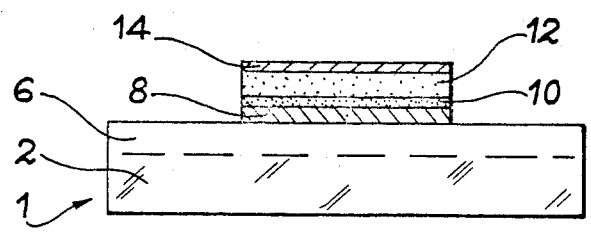

As shown in FIG. 3, the following stage of the process consists of etching the stack of layers 8, 10, 12, 14, according to conventional lithography processes, in order to produce the gate of the MIS structure. This etching is performed by using a resin mask defining the dimensions of the gate of the MIS structure and by chemically and selectively etching said layers, which is well known in the art.

Figure 4:
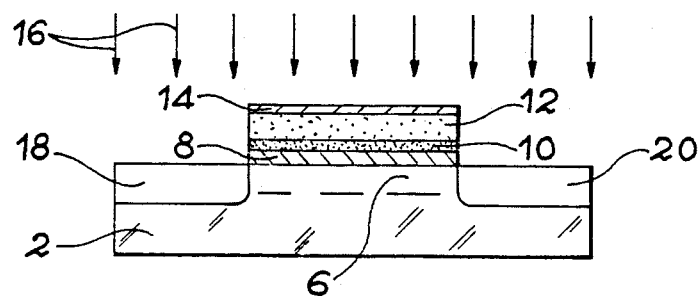

As shown in FIG. 4, this is followed by an ion implantation 16, the stack of etched layers 8 to 14 serving as a mask for said implantation. On the upper surface of substrate 2 and on either side of the etched stack, this implantation makes it possible to define two implanted regions 18 and 20, respectively representing the source and the drain of the MIS structure.

This implantation is carried out with n-type ions (Si, S, Se) at a dose of $10^{19}$ atoms/$cm^2$. It is followed by an electric activation annealing of the implanted ions by heat flash, as described in the aforementioned Narayan article. This thermal irradiation is in particular performed at 700° C. for approximately 5 seconds and is broughtabout according to the invention by tungsten halogen lamps.

Figure 5:
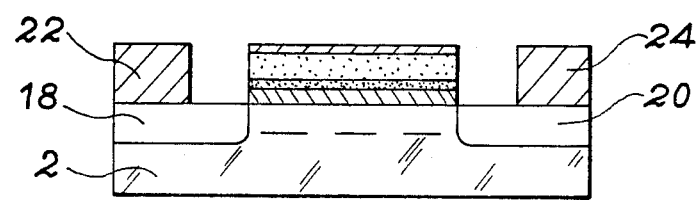

As shown in FIG. 5, the following stage of the process consists of producing the connections 22 and 24 respectively of source 18 and drain 20 of the MIS structure. These metallizations 22, 24 are of aluminium or titanium-gold-germanium by definition of the dimensions of said metallizations with the aid of a lithography stage producing a resin mask, followed by vacuum evaporation deposition of the metal, followed by an elimination of the resin, which leads to the elimination of the metal covering it. This procedure is called lift off.

Figure 6:
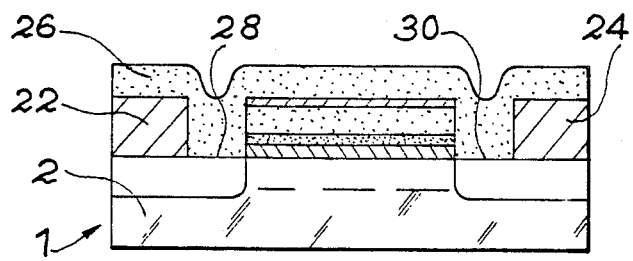

The final stage of the process, as shown in FIG. 6, comprises depositing on the complete structure an insulating passivating layer 26, which is in particular of $SiO_2$ deposited under the same operating conditions as the gate insulant 12 (stage B, FIG. 2b) and after subjecting the non-metallized zones of substrate 28 and 30 to a surface preparation stage A (FIG. 2b), in accordance with the invention.

FIG. 7 diagrammatically shows an apparatus making it possible to perform the process according to the invention. This apparatus has a horizontal configuration and incorporates a vacuum enclosure 32 in which are placed, within a quartz tube, several samples 1 to be treated made from III-V material. The sample supports must have the lowest possible thermal inertia and must not be in contact with the samples (e.g. gas cushions).

Gases necessary for the preparation of the surface of the samples, for the deposition of the insulating layer 12 and optionally the conductive layer 14 are introduced at one of the ends 34 of the assembly, the other end being e.g. used for placing enclosure 32 under a vacuum.

FIG. 7 shows six gas supply pipes 36a to 36f. Pipe 36 is e.g. used for introducing the gases supplying the V element to the surfaces of the III-V substrates, such as $AsH_3$ or $PH_3$. Pipe 36b is used for introducing a neutral gas, such as an inert gas or nitrogen, with a view to purging the complete apparatus between each gaseous phase chemical reaction. Supply pipe 36c is used for introducing sulphiding or nitriding gases, such as $NH_3$ and $SH_3$. Supply pipe 36d is used for introducing the gases of the silicon, given in Tables 1 and 2. Supply pipe 36e is used for introducing gaseous oxygenated compounds (cf. Tables 1 and 2), such as $O_2$. Finally, supply pipe 36f is used for introducing gaseous metallic compounds, such as $W(CO)_6$.

The supply pipes 36a-36f for the different gases are equipped with electrovalves 38 connected to an electronic control circuit 40. A pressure gauge 42, connected to an electronic reading circuit 44, makes it possible to measure the pressure prevailing within the enclosure 32. These measurement informations are supplied to a computer 46, which then controls the electronic control circuit 40 of electrovalves 38.

The vacuum enclosure 32 is placed in a tungsten halogen lamp oven 48 making it possible to subject samples 1, facing the lamps, to the different heat flashes used during the preparation of the substrate, during the deposition of the insulating layer and optionally the deposition of the conductive layer.

The tungsten halogen lamp oven can be constituted by the "Machine Heat pulse" by A. G. Associates (Palo Alto, Calif., USA), or the "Machine Addax" by AET (Chemin de malacher ZIRST, Meylan, France).

Temperature measuring probes 50 (e.g. of the thermocouple type) located within enclosure 32 make it possible to measure the temperature of the samples. The measured temperature is supplied via an electronic reading circuit 52 to computer 46 with a view to regulating the heating temperature and the duration of the thermal irradiations. Therefore computer 46 is connected to an electric supply and electronic control circuit 54 for the tungsten halogen lamps 48.

The aforementioned apparatus makes it possible to automatically regulate the deposition and thermal irradiation temperatures, as well as the gaseous flow rate as a function of the nature of the III–V material substrate to be treated, the nature of the surface preparation stage of said substrates, the type of deposit of the insulating layer and optionally that of the conductive layer for an MIS structure.

The invention has been described in non-limitative manner hereinbefore relative to embodiments and variants thereto can be envisaged without passing beyond the scope of the invention. In particular, the apparatus for performing the invention can have a vertical instead of a horizontal configuration.

We claim:

1. Process for depositing an electrically insulating layer (12) on a III–V material substrate (6), comprising at least one first stage (A) of preparing the surface of the substrate (6) performed under a heat flash and a second stage (B) of chemical vapour phase deposition of said insulating layer (12) at a temperature exceeding the non-congruent decomposition temperature of the substrate surface, said second stage (B) being performed by exposing the substrate (6) to a heat flash.

2. Process according to claim 1, characterized in that the first and second stages are performed in the same enclosure (32).

3. Process according to claim 1, characterized in that the material is chosen from among GaAs, InP, $Ga_xIn_{1-x}As_yP_{1-y}$ and $Al_xGa_yIn_{1-x-y}As$ wherein $0 \leq x \leq 1$ and $0 \leq y \leq 1$.

4. Process according to claim 1, characterized in that the substrate (6) is subject to a heat flash using tungsten halogen lamps (48).

5. Process according to claim 1, characterized in that the first stage (A) involves a stage of etching the surface of substrate (6).

6. Process according to claim 1, characterized in that the first stage (A) has a stage (8a) of supplying a V element to the substrate surface.

7. Process according to claim 1, characterized in that the first stage (A) has a stage (10a) of encapsulating the surface of substrate (6) with an insulating material (10).

8. Process according to claim 1, characterized in that the first stage (A) involves an epitaxy stage of a semiconductor layer on the surface of the substrate.

9. Process according to claim 1, characterized in that the insulating layer (12) is an undoped polycrystalline silicon layer, a silicon nitride layer or a silicon dioxide layer.

10. Process according to claim 1, characterized in that the second stage (B) comprises depositing on the substrate surface under heat flash a polycrystalline silicon layer, and then thermally oxidizing or nitriding the silicon layer.

11. Process according to claim 1 for the production of a MIS structure (1) on a III–V material substrate (2), involving an electrically insulating layer (12) surmounted by a conductive layer (14), characterized in that after the insulating layer (12) is deposited, the conductive layer (14) is then deposited at high temperature on said insulating layer.

12. Process according to claim 11, characterized in that the conductive layer (14) is of highly doped polycrystalline silicon and the surface of structure (1) undergoes a heat flash simultaneously with the deposition of said conductive layer.

13. Process according to claim 11, characterized in that the conductive layer (14) is of metal and said layer is deposited by pyrolysis of carbonyle or hexafluoride of said metal.

14. Process according to claim 11, characterized in that the depositions of the insulating layer (12) and the conductive layer (14) are performed in the same deposition enclosure (32).

* * * * *